(12) United States Patent
Chen

(10) Patent No.: US 11,099,062 B2
(45) Date of Patent: Aug. 24, 2021

(54) ELECTRONIC DEVICE

(71) Applicant: BEIJING XIAOMI MOBILE SOFTWARE CO., LTD., Beijing (CN)

(72) Inventor: Chaoxi Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 18 days.

(21) Appl. No.: 16/699,544

(22) Filed: Nov. 29, 2019

(65) Prior Publication Data

US 2020/0386614 A1 Dec. 10, 2020

(30) Foreign Application Priority Data

Jun. 5, 2019 (CN) .......................... 201910487530.6

(51) Int. Cl.
| | | |
|---|---|---|
| *G01J 1/04* | (2006.01) | |
| *G01J 1/02* | (2006.01) | |
| *G09G 3/34* | (2006.01) | |
| *G01J 1/06* | (2006.01) | |
| *H04M 1/02* | (2006.01) | |
| *H01S 5/183* | (2006.01) | |

(52) U.S. Cl.
CPC ........... *G01J 1/0477* (2013.01); *G01J 1/0233* (2013.01); *G01J 1/06* (2013.01); *G09G 3/3406* (2013.01); *H04M 1/0266* (2013.01); *G09G 2360/145* (2013.01); *H01S 5/183* (2013.01); *H04M 2250/12* (2013.01)

(58) Field of Classification Search
None
See application file for complete search history.

(56) References Cited

U.S. PATENT DOCUMENTS

| | | | |
|---|---|---|---|
| 2011/0149597 A1* | 6/2011 | Jao ..................... | G02B 6/0031 362/607 |
| 2011/0175852 A1* | 7/2011 | Goertz ................. | G06F 3/0421 345/175 |
| 2012/0230050 A1* | 9/2012 | Kim ..................... | G02B 6/0068 362/602 |
| 2013/0121025 A1* | 5/2013 | Lin ...................... | F21V 7/00 362/609 |
| 2014/0210793 A1* | 7/2014 | Eriksson ............... | F24C 7/083 345/175 |
| 2017/0023725 A1* | 1/2017 | Oki ...................... | G02B 6/0038 |
| 2017/0090580 A1* | 3/2017 | Pothier ................. | G01S 17/58 |
| 2019/0280057 A1* | 9/2019 | Li ........................ | H01L 23/552 |

FOREIGN PATENT DOCUMENTS

| | | | |
|---|---|---|---|
| CN | 108023983 A | 5/2018 | |
| CN | 108924279 A | 11/2018 | |
| CN | 109274787 A | 1/2019 | |
| WO | WO2020038033 A1 * | 5/2019 | ............... H04M 1/02 |

OTHER PUBLICATIONS

OA1 for EP Application 19219394.4, dated Jun. 25, 2020.
OA for CN application 201910487530.6, dated Jun. 28, 2021.

* cited by examiner

*Primary Examiner* — Krishna P Neupane
(74) *Attorney, Agent, or Firm* — Syncoda LLC; Feng Ma

(57) ABSTRACT

An electronic device includes a device body, a screen, and a photo-sensing module. The screen is mounted on a front side of the device body. The photo-sensing module includes a light emitter and a light receiver. The light emitter is arranged obliquely relative to the screen, and a direction of the emitted light from the light emitter is tilted towards the side with the screen relative to the device body.

15 Claims, 2 Drawing Sheets

ELECTRONIC DEVICE

CROSS-REFERENCE TO RELATED APPLICATION

This application claims priority to Chinese Patent Application Serial No. 201910487530.6 filed on Jun. 5, 2019, the disclosure of which is hereby incorporated by reference in its entirety.

BACKGROUND

To increase a screen-to-body ratio of an electronic device such as a mobile phone, a size of a non-display area of a front surface of the electronic device is usually reduced, and a light-transmissible hole cooperating with a photosensor is defined in the non-display area or a light-transmissible area matching a size of the photosensor is arranged on a screen.

SUMMARY

The present disclosure generally relates to the field of electronic technologies, and more specifically, to an electronic device.

Embodiments of the present disclosure provide an electronic device, including: a device body, a screen, and a photo-sensing module. The screen is mounted on a front side of the device body. The photo-sensing module includes a light emitter and a light receiver, the light emitter is obliquely arranged relative to the screen, and a direction of an emitted light from the light emitter is tilted towards a side with the screen relative to the device body.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this disclosure, illustrate embodiments consistent with the disclosure and, together with the description, serve to explain the principles of the disclosure.

DETAILED DESCRIPTION

Figure 1:
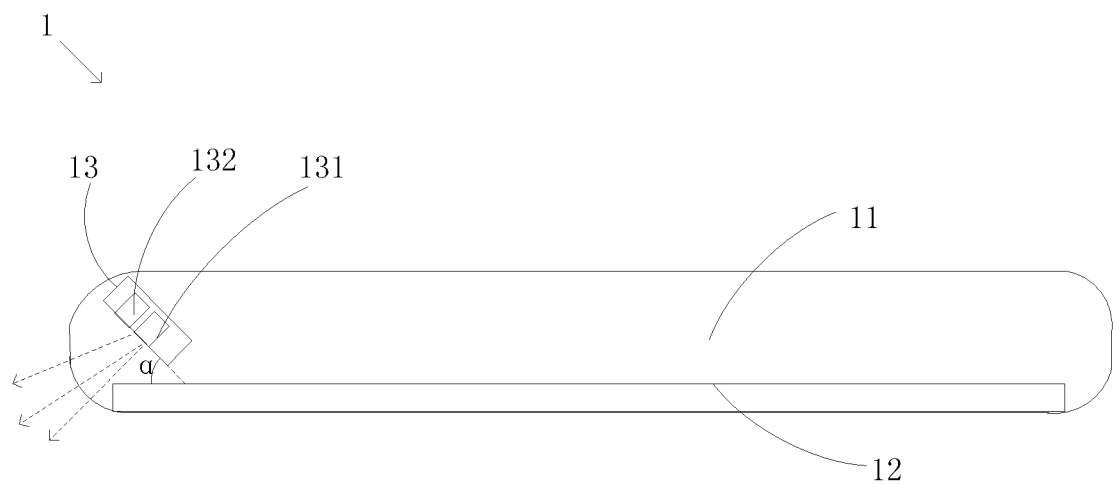
FIG. 1 is a sectional schematic diagram of an electronic device according to some embodiments of the present disclosure.

Exemplary embodiments of the present disclosure will be described in detail and examples of the embodiments will be illustrated in the drawings. When the following description refers to the drawings, unless specified otherwise, the same numbers in different drawings represent the same or similar elements. The implementations described in the following exemplary embodiments do not represent all implementations consistent with the present disclosure, and instead they are merely examples of devices and methods consistent with aspects of the present disclosure as detailed in the appended claims.

A size of a non-display area of a front surface of an electronic device can usually be reduced, and a light-transmissible hole cooperating with a photosensor can be defined in the non-display area or a light-transmissible area matching a size of the photosensor is arranged on a screen, in order to raise a screen-to-body ratio of the electronic device, such as a mobile phone. However, a display effect of the screen and an aesthetic appearance of the whole device are still affected due to the existing non-display area even with the size reduction. The display effect of the screen is reduced with the light-transmissible area, as light emits out perpendicularly to the light-transmissible area on the screen.

FIG. 1 is a sectional schematic diagram of an electronic device according to some embodiments of the present disclosure.

As illustrated in FIG. 1, the electronic device 1 includes a device body 11, a screen 12 and a photo-sensing module 13. The screen 12 is mounted on a front side 111 of the device body 11. The photo-sensing module 13 includes a light emitter 131 and a light receiver 132. The light emitter 131 is obliquely arranged relative to the screen 12 at an angle $\alpha$, and a direction of an emitted light from the light emitter 131 is tilted towards a side with the screen relative to the device body 11.

In some embodiments, the angle $\alpha$ is larger than 0 degree and less than 90 degrees. In some embodiments, the angle $\alpha$ is about 45 degrees.

With the arrangement that the light emitter 131 of the photo-sensing module 13 is tilted relative to the screen 12, the direction of the emitted light from the light emitter 131 is tilted towards the side with screen 12 relative to the device body 11. Since a light path of the emitted light can be tilted towards the side with the screen 12, it is convenient to sense an obstacle 2 approaching the front side of the electronic device 1. Therefore, the above structure does not occupy structures in a display area of the screen 12, thereby raising a screen-to-body ratio of the electronic device 1 and guaranteeing a photo-sensing effect of the photo-sensing module 13.

In the above embodiments, the emitted light from the light emitter 131 can be emitted from a preset side surface 112 of the device body 11 and tilted towards the side with the screen 12, such that contact and interference between a light path of the emitted light and the screen 12 can be avoided, and an display effect of the screen 12 is improved. Alternatively, the light emitted from the light emitter 131 can also be emitted from other positions of the screen 12 or other positions of the front side of the device body 11, as long as the emitted light can be tilted towards the side with the screen, which is not limited in the present disclosure.

Furthermore, the light receiver 132 can also be obliquely arranged relative to the screen 12 at an angle $\alpha$, in order to receive a receiving light reflecting off the obstacle 2 when the emitted light encounters the obstacle. Alternatively, the light receiver 132 can also be arranged in parallel to the screen 12 or at another angle relative to the screen 12, as long as the light receiver 132 can receive the receiving light, which is not limited in the present disclosure.

Figure 2:
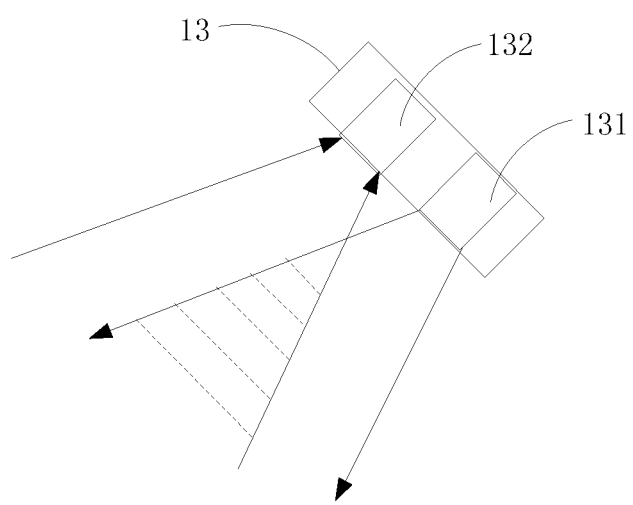
FIG. 2 is a schematic diagram of a light path of a photo-sensing module according to some embodiments of the present disclosure.

In the above embodiments, the light emitter 131 of the photo-sensing module 13 can emit an emitted light of corresponding type. As illustrated in FIG. 2, the light path of the emitted light and a light path of the receiving light forms an overlap area indicated by dashed lines. When the emitted light encounters the obstacle 2 in the overlap area, the receiving light reaches the light receiver 132 and is received by the light receiver 132. The photo-sensing module 13 can monitor strength and a return time of the receiving light, to calculate a distance between the obstacle 2 and the electronic device 1. When the distance is smaller than a preset value, the electronic device 1 can be controlled to turn off the screen to avoid touch on the screen 12 by mistake, and power consumption is reduced as well.

For example, the light emitter 131 can be a vertical cavity surface emitting laser (VCSEL) or an infrared light emitting diode (LED). The light receiver 132 can be a photo diode (PD) or a single photon avalanche diode (SPAD) which is a photoelectric detection avalanche diode with single photon detection capacity). When the light emitter 131 is a VCSEL, the emitted light is laser light. When the light emitter 131 is the infrared light emitting diode, the emitted light is infrared light. Particularly, the infrared light can be infrared light of 850 nm/940 nm. During operation of the light emitter 131, a part of the emitted light reflects off a side wall of the device body 11 or other structure of the electronic device 1, in such case, the light reflected back to the photo-sensing module 13 becomes ground noise which affects the sensing effect. Because the VCSEL has a small emitting angle and concentrated emitting energy with less reflected light, the photo-sensing module 13 receives less ground noise, while the infrared light emitting diode has large emitting angle with many reflected light paths, the probability of ground noise is large.

The electronic device 1 can be a mobile phone, a tablet computer, an in-vehicle device, a medical terminal, etc., which is not limited in the present disclosure. In the following, the mobile phone is taken as an example of the electronic device 1, cooperation between the photo-sensing module 13 and the device body 11 of the mobile terminal is exemplarily illustrated.

Figure 3:
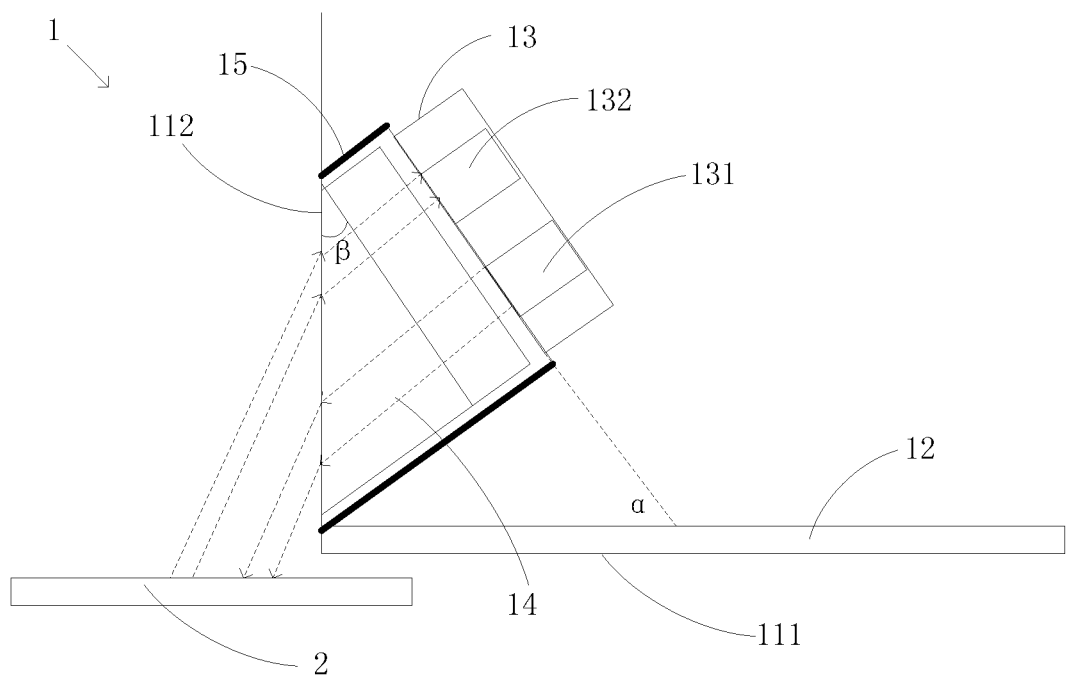
FIG. 3 is a partial sectional schematic diagram of an electronic device according to some embodiments of the present disclosure.

In an embodiment, as illustrated in FIG. 3, in order to further change the light path of the emitted light and improving the photo-sensing effect of the photo-sensing module 13 of the mobile phone, the mobile phone can further include a light guide member 14. The light guide member 14 has a first refracting surface corresponding to a position of the light emitter 131 and a second refracting surface corresponding to the preset side surface 112, such that the emitted light enters the light guide member 14 through the first refracting surface and exits out through the second refracting surface in a manner of a refracted light. An angle between the refracted light and the preset side surface 112 is less than an angle between the emitted light and the preset side surface 112. The light guide member 14 causes the emitted light to refract for further tilting towards the side with the screen 12.

When the user operates the mobile phone and the user's face approaches the front side 111 of the device body 11, the refracted light is easily changed into a reflected light reflecting off the user's face based on the angle between the refracted light and the preset side surface 112, and the reflected light is received by the light receiver 132. Therefore, with the light guide member 14, the sensitivity and accuracy of the photo-sensing module 13 for sensing the light emitted through the preset side surface 112 of the device body 11 are improved.

Furthermore, an angle between the first refracting surface and the second refracting surface can be an acute angle (3, such that the angle between the refracted light and the preset side surface 112 is less that the angle between the emitted light and the preset side surface 112, and meanwhile the light guide member 14 occupies less space in the electronic device 1.

Furthermore, the emitted light propagates through a light-leakage surface, i.e. side surface(s) of the light guide member 14 except the first refracting surface and the second refracting surface, such that the emitted light exiting through the light-leakage surface not only reduces intensity of light emitted through the preset side surface 112, but also makes the reflected light reach the photo-sensing module 13 and cause ground noise interference, as well as light leakage in the electronic device 1. Therefore, the electronic device 1 can further include a light absorber 15. In an embodiment, the light absorber 15 can be black coating or a black member fitted with the light-leakage surface, which is not limited in the present disclosure. In another embodiment, the light guide member 14 can be a structure arranged between the photo-sensing module 13 and the preset side surface 112, and the light guide member 14 can partially or fully fill a gap between the photo-sensing module 13 and the preset side surface 112.

When the light guide member 14 fully fills the gap between the photo-sensing module 13 and the preset side surface 112, the light-leakage surface of the light guide member 14 is directly fitted with an inner side wall of the device body 11, therefore, the light absorber 15 can be directly arranged on the inner side wall of the device body 11 corresponding to the light-leakage surface. Similarly, this light absorber 15 can be the black coating or the black member arranged on the inner side wall of the device body 11. With the light absorber 15, the intensity of the light emitted through the preset side surface 112 is enhanced, the ground noise interference on the photo-sensing module 13 due to the reflected light and light leakage in the electronic device 1 can be avoided.

It should be noted that, the light guide member 14 can be a triangular prism or other lens capable of refracting, which is not limited in the present disclosure.

Figure 4:
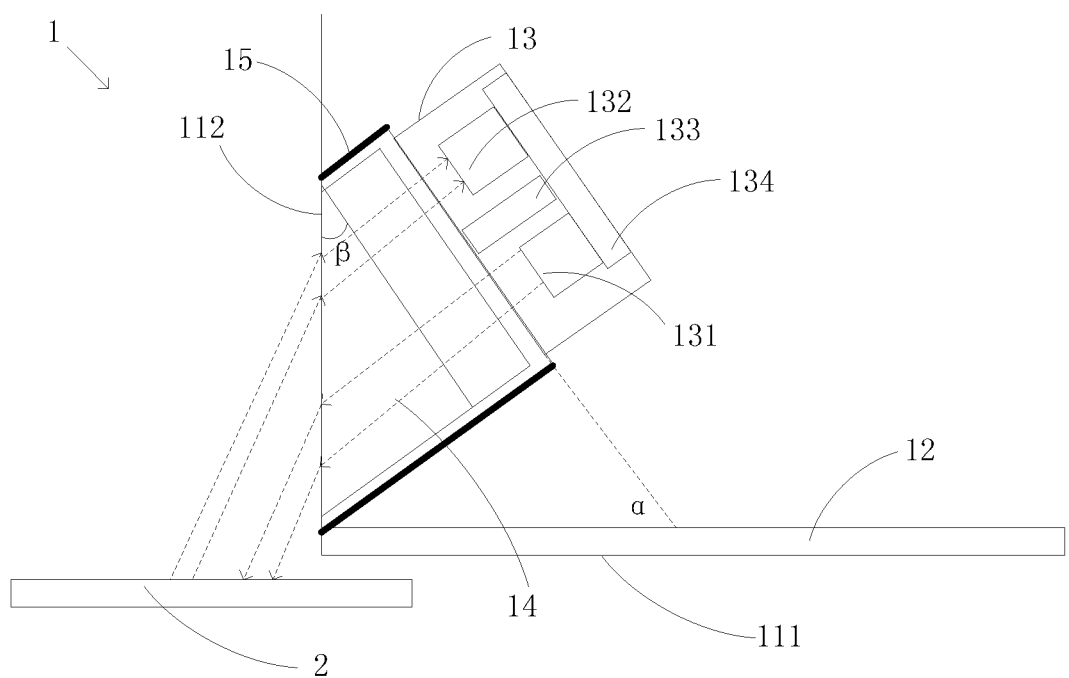
FIG. 4 is another partial sectional schematic diagram of an electronic device according to some embodiments of the present disclosure.

In another embodiment, as illustrated in FIG. 4, the photo-sensing module 13 further includes a barrier wall 133, and the barrier wall 133 is arranged between the light emitter 131 and the light receiver 132. After being emitted from the light emitter 131, the emitted light may form a reflected light after reaching the inner side wall of the device body 11, the screen 12, or the light guide member 14, therefore, the barrier wall 133 arranged between the light emitter 131 and the light receiver 132 can prevent ground noise caused by the reflected light reaching the photo-sensing module 13.

In addition, the photo-sensing module 13 can further include a photosensitive chip 134, the light emitter 131 and the light receiver 132 are electrically coupled with the photosensitive chip 134, such that the light emitter 131 and the light receiver 132 are controlled to emit light or calculate and analyze the receiving light.

In the above embodiments, the preset side surface 112 of the device body 11 can be a top side surface, left side surface, right side surface, or a lower side surface of the device body 11, which can be arranged according to specific usage habits of the electronic device 1, which is not limited in the present disclosure. When the electronic device 1 is the mobile phone, the preset side surface 112 can be an upper side surface of a middle frame of the mobile phone, that is, the photo-sensing module 13 is arranged on a top portion of the mobile terminal, in order to sense and feedback approaching of the user's face during usage.

The various device components, circuits, modules, units, blocks, or portions may have modular configurations, or are composed of discrete components, but nonetheless may be referred to as "modules" or "portions" in general. In other words, the "components," "circuits," "modules," "units," "blocks," or "portions" referred to herein may or may not be in modular forms.

Specifically, when the user gets through by the mobile phone, the user's face approaches the front side 111 of the device body 11, the user aligns the user's ear with a receiver on the top portion of the mobile phone and aligns the user's mouth with a microphone on a lower portion of the mobile phone. The area and probability that the light is shielded by the top portion of the mobile phone are large based on the above usage habits, the light sensitivity can be improved with the photo-sensing module 13 arranged on the top portion of the mobile phone.

Furthermore, the preset side surface 112 is provided with a light-transmitting area, and the light-transmitting area includes an aperture structure or a structure having a light-transmitting material. The aperture structure on the preset side surface 112 can raise passing rate of the emitted light, thereby improving the sensing effect of the photo-sensing module 13. With the structure having the light-transmitting material on the preset side surface 112, the whole artistic appearance of the electronic device 1 can be improved. For example, when the emitted light is an infrared light of 850 nm/940 nm, the structure of the light-transmitting area of the preset side surface 112 can be made of a light-transmitting material only permitting the infrared light of 850 nm/940 nm to pass through.

In addition, the screen 12 can be a full screen covering the front side 111 of the device body 11, in order to improve a display effect.

The light emitter 131 of the photo-sensing module 13 is tilted relative to the screen 12, such that a direction of the emitted light from the light emitter 131 is tilted towards the side with the screen 12 relative to the device body 11. Since the light path of the emitted light can be tilted towards the side with the screen 12, the obstacle 2 approaching the front side of the electronic device 1 can be easily sensed. Therefore, the above structure does not occupy structures in a display area of the screen 12, thereby raising the screen-to-body ratio of the electronic device 1 and guaranteeing the photo-sensing effect of the photo-sensing module 13.

It will be understood that when an element such as a layer, region, or other structure is referred to as being "on" or extending "onto" another element, it can be directly on or extend directly onto the other element or intervening elements can also be present. In contrast, when an element is referred to as being "directly on" or extending "directly onto" another element, there are no intervening elements present.

Likewise, it will be understood that when an element such as a layer, region, or substrate is referred to as being "over" or extending "over" another element, it can be directly over or extend directly over the other element or intervening elements can also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Relative terms such as "below" or "above" or "upper" or "lower" or "vertical" or "horizontal" can be used herein to describe a relationship of one element, layer, or region to another element, layer, or region as illustrated in the drawings. It will be understood that these terms and those discussed above are intended to encompass different orientations of the device in addition to the orientation depicted in the drawings. The terms "first" and "second" are used for descriptive purposes only and are not to be construed as indicating or implying a relative importance or implicitly indicating the number of technical features indicated. Thus, elements referred to as "first" and "second" can include one or more of the features either explicitly or implicitly. In the description of the present disclosure, "a plurality" indicates two or more unless specifically defined otherwise.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It is to be understood that "multiple" mentioned in the present disclosure refers to two or more than two. "And/or" describes an association relationship of associated objects and represent that three relationships can exist. For example, A and/or B can represent three conditions, i.e., independent existence of A, coexistence of A and B and independent existence of B. Character "/" usually represents that previous and next associated objects form an "or" relationship.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. An electronic device, comprising:
a device body,
a screen mounted on a front side of the device body, and
a photo-sensing module comprising a light emitter and a light receiver, the light emitter being obliquely arranged relative to the screen, and a direction of an emitted light from the light emitter being tilted towards a side with the screen relative to the device body,
wherein the emitted light from the light emitter is emitted from a preset side surface of the device body and tilted towards the side with the screen,
wherein the electronic device further comprises a light guide member having a first refracting surface corresponding to a position of the light emitter, and a second refracting surface corresponding to the preset side surface, such that the emitted light enters the light guide member through the first refracting surface and exits out through the second refracting surface in a manner of a refracted light; and wherein an angle between the refracted light and the preset side surface is less than an angle between the emitted light and the preset side surface, and the light guide member is configured to cause the emitted light to refract for further tilting towards the side with the screen,
wherein an angle between the first refracting surface and the second refracting surface is an acute angle β, such that the angle between the refracted light and the preset side surface is less that the angle between the emitted light and the preset side surface; wherein the electronic device further comprises a light absorber fitted with a light-leakage surface of the light guide member; and wherein the light guide member fully fills a gap between the photo-sensing module and the preset side surface, and the light-leakage surface of the light guide member is directly fitted with an inner side wall of the device body, the light absorber is directly arranged on the inner side wall of the device body corresponding to the light-leakage surface.

2. The electronic device according to claim 1, wherein the light receiver is obliquely arranged relative to the screen, in order to receive a receiving light reflecting off an obstacle when the emitted light encounters the obstacle.

3. The electronic device according to claim 1, wherein the light guide member comprises a triangular prism.

4. The electronic device according to claim 1, wherein the photo-sensing module further includes a barrier wall, and the barrier wall is arranged between the light emitter and the light receiver.

5. The electronic device according to claim 1, wherein the preset side surface is a top side surface of the device body.

6. The electronic device according to claim 1, wherein the preset side surface is provided with a light-transmitting area, and the light-transmitting area comprises an aperture structure or a structure having a light-transmitting material.

7. The electronic device according to claim 1, wherein the electronic device is a mobile phone, and wherein the mobile phone is configured to have the emitted light from the light emitter exit from an edge of the mobile phone.

8. The electronic device according to claim 7, wherein the direction of the emitted light from the light emitter is tilted towards the side with the screen relative to the device body to facilitate sensing of an approaching object toward the side with the screen while improving a screen-to-body ratio.

9. The electronic device according to claim 8, wherein mobile phone is configured to sense the approaching object including a user face.

10. The electronic device according to claim 9, wherein the screen is a liquid-crystal display (LCD) or organic light-emitting diode (OLED) screen.

11. The electronic device according to claim 10, wherein the light emitter comprises a vertical cavity surface emitting laser (VCSEL) to reduce light reflected by the edge of the mobile phone back to the photo-sensing module becoming ground noise.

12. The electronic device according to claim 11, wherein the light receiver comprises a single photon avalanche diode (SPAD).

13. The electronic device according to claim 12, wherein the light emitter is obliquely arranged relative to the screen at an angle α, and wherein angle α is larger than 0 degree and less than 90 degrees.

14. The electronic device according to claim 13, wherein angle α is about 45 degrees.

15. The electronic device according to claim 1, wherein a light path of the emitted light from the light emitter is not in contact with the screen and does not interfere with the screen.

\* \* \* \* \*